United States Patent
Haase et al.

[11] Patent Number: 5,989,738
[45] Date of Patent: Nov. 23, 1999

[54] ORGANIC ELECTROLUMINESCENT COMPONENT WITH CHARGE TRANSPORT LAYER

[75] Inventors: Markus Haase, Hamburg; Ulrich Kynast, Steinfurt; Herbert Boerner; Cornelis Ronda, both of Aachen, all of Germany

[73] Assignee: U.S. Philips Corporation, New York, N.Y.

[21] Appl. No.: 08/881,648

[22] Filed: Jun. 24, 1997

[30] Foreign Application Priority Data

Jun. 28, 1996 [DE] Germany ............... 196 25 993

[51] Int. Cl.$^6$ ............................................. H05B 33/13
[52] U.S. Cl. ..................... 428/690; 428/691; 428/917; 313/504
[58] Field of Search ........................ 428/690, 691, 428/917; 313/504

[56] References Cited

U.S. PATENT DOCUMENTS

| | | | |
|---|---|---|---|
| 4,795,617 | 1/1989 | O'Hare | 422/186.15 |
| 4,841,293 | 6/1989 | Takimoto | 340/763 |
| 4,902,929 | 2/1990 | Toyoda et al. | 313/503 |
| 5,069,815 | 12/1991 | Aoki et al. | 252/301.36 |
| 5,128,587 | 7/1992 | Skotheim et al. | |
| 5,200,668 | 4/1993 | Ohashi et al. | 313/498 |
| 5,369,333 | 11/1994 | Inoguchi et al. | 313/509 |
| 5,446,577 | 8/1995 | Bennett et al. | 359/273 |
| 5,496,597 | 3/1996 | Soininen et al. | 427/584 |
| 5,739,635 | 4/1998 | Wakimoto | 313/504 |
| 5,747,929 | 5/1998 | Kato et al. | 313/503 |
| 5,773,929 | 6/1998 | Shi et al. | 313/504 |

FOREIGN PATENT DOCUMENTS 5-041285  2/1993  Japan ............... H05B 33/22

OTHER PUBLICATIONS

"Organic EL Devices with Methal Oxides as a Hole–Injecting Layer" by S. Tokito et al presented at a conference of "The Japan Society of Applied Physics and Related Societies" Mar. 26, 1996.

"Recent Developments in Molecular Organic Electroluminescent Materials", by C.H. Chen et al in Macromol. Symp. vol. 125, pp. 1–48 specifically p. 18–19, 1997.

*Primary Examiner*—Charles Nold
*Attorney, Agent, or Firm*—Norman N. Spain

[57] ABSTRACT

An organic electroluminescent component with a layer arrangement includes a first electrode layer, an inorganic layer which conducts electrons, one or several optoelectronically active layers with at least one light-emitting layer which comprises an organic emitter, and a second electrode layer. The inorganic layer which conducts electrons is an N-type conducting oxide of a transition metal chosen from the group consisting of zirconium oxide, hafnium oxide, vanadium oxide, barium titanate, barium-strontium titanate, strontium titanate, calcium titanate, calcium zirconate, potassium tantalate, and potassium niobate.

4 Claims, 1 Drawing Sheet

ORGANIC ELECTROLUMINESCENT COMPONENT WITH CHARGE TRANSPORT LAYER

BACKGROUND OF THE INVENTION

The invention relates to an organic electroluminescent component, in particular a light-emitting diode (LED) for luminous signs, luminaires, solid-state image intensifiers, or picture screens, with a layer arrangement comprising a first electrode layer, an inorganic layer which conducts electrons, one or several optoelectronically active layers with at least one light-emitting layer which comprises an organic emitter, and a second electrode layer.

Prior-art LEDs are usually inorganic semiconductor diodes, i.e. diodes whose emitter material is an inorganic semiconductor such as doped zinc sulphide, silicon, germanium, or III-V semiconductors, for example InP, GaAs, GaAlAs, GaP, or GaN with suitable dopants.

Work has been going on for several years in the development of luminescent radiation sources in which the emitter material is not an inorganic semiconductor but an organic electrically conductive material.

Electroluminescent components with light-emitting layers built up from organic materials are clearly superior to light sources made from inorganic materials in a number of respects. An advantage is their easy plasticity and high elasticity which opens new possibilities for applications such as luminous signs and picture screens. These layers may readily be manufactured as large-area, flat, and very thin layers which in addition require little material. They excel through their remarkably high brightness accompanied by low operating voltages.

In addition, the color of the emitted light can be varied over a wide range from approximately 400 nm up to approximately 650 nm through the choice of the luminescent material. These colors have a striking luminance.

Such organic electroluminescent components may be built up in various ways. They all have in common that one or several optoelectronically active organic layers, among which the light-emitting layer, are arranged between two electrode layers to which the voltage necessary for operating the component is applied. At least one of the electrode layers is transparent to visible light so that the emitted light can emerge to the exterior. The entire layer construction is usually provided on a substrate which is also transparent to visible light if the emitted light is to issue from the side facing the substrate.

The layer sequence of the optoelectronically active organic layers is known in several variations. For example, the light-emitting layer comprising a thin stratum of organic pigment molecules and possibly conductive organic polymers may be embedded between two further electrically conductive organic layers which transport charge carriers from the two electrodes to the light-emitting layer. The electrically conductive organic layer between the light-emitting layer and the cathode conducts electrons whereas the corresponding layer between the light-emitting layer and the anode conducts holes.

The use of such organic charge carrier transport layers, however, also involves problems. The thermal load on the layers during operation and material interactions between the electrode layers and the transport layers lead to a deterioration of the luminous efficacy of the component in the course of time. The useful life of the organic electron-conducting layer is very short in this case, in particular when strongly reducing metals such as calcium or magnesium, which have a particularly low work function for the electrons, are used as the cathode material in order to achieve a high luminous efficacy.

It is accordingly proposed in U.S. Pat. No. 5,128,587 to choose a composition of an organic or alternatively inorganic semiconductor for the charge transport layer which transports electrons and lies between the electrode with low work function and the luminescent film. Inorganic semiconductors proposed here are Ge, Si, Sn, SiC, AlSb, BN, BP, GaN, GaSb, GaAs, GaP, InSb, InAs, InP, CdSe, CdTe, ZnO, ZnS, or ZnSe. The semiconducting layer may be amorphous or crystalline and it may be an N-type doped semiconductor or an intrinsic semiconductor.

A disadvantage of a component having a charge transport layer with an inorganic semiconductor of the kind mentioned above is that this layer absorbs light in the visible spectrum range.

SUMMARY OF THE INVENTION

It is accordingly an object of the invention to provide an organic electroluminescent component with improved properties.

According to the invention, this object is achieved by means of an organic electroluminescent component with a layer structure comprising a first electrode layer, an inorganic layer which conducts electrons, one or several optoelectronically active layers with at least one light-emitting layer which comprises an organic emitter, and a second electrode layer, which is characterized in that the inorganic layer which conducts electrons is an N-type conducting oxide of a transition metal chosen from the group comprising zirconium oxide, hafnium oxide, vanadium oxide, barium titanate, barium-strontium titanate, strontium titanate, calcium titanate, calcium zirconate, potassium tantalate, and potassium niobate.

Such inorganic layers conducting electrons have a high thermal and chemical stability and achieve a very good electron contact to the emitter molecules. They may be manufactured with ceramic surfaces of defined roughness which render it possible to accommodate more emitter molecules and thus to increase the active surface area. The oxides do not absorb light in the visible range and are transparent in thin layers.

It is preferred within the scope of the present invention that the N-type conducting oxide chosen from the group comprising zirconium oxide, hafnium oxide, vanadium oxide, barium titanate, barium-strontium titanate, strontium titanate, calcium titanate, calcium zirconate, potassium tantalate, and potassium niobate is a doped oxide.

It may also be preferred that the oxide of the transition metal is niobium-doped strontium titanate $SrTiO_3$. Strontium titanate $SrTiO_3$ doped with niobium is particularly photoactive.

It may also be preferable that the organic emitter is a rare earth metal complex with a ligand comprising a carboxylate or a phosphonate group.

The light-emitting complex is grafted to the oxide surface by these ligands. An interlocking group is formed thereby between the rare earth metal ion and the charge transport layer, which achieves a close electronic coupling between the two.

The bonding of the emitter molecules to the oxide layers, which have a high refractive index, in addition reduces the life of the excited state of the emitter molecule and thus the fluorescence decaying time. This is advantageous for display applications because the detrimental afterglow of moving objects in the picture (comet tail effect) is eliminated.

BRIEF DESCRIPTION OF THE DRAWING

The invention will be explained in more detail below with reference to Figures and embodiments.

DESCRIPTION OF THE PREFERRED EMBODIMENTS

The organic electroluminescent component according to the invention comprises a layer structure with a first electrode layer (cathode), an inorganic layer 1 which conducts electrons, one or several optoelectronically active layers with at least one light-emitting layer comprising an organic emitter 4, and a second electrode (anode).

Figure 1:
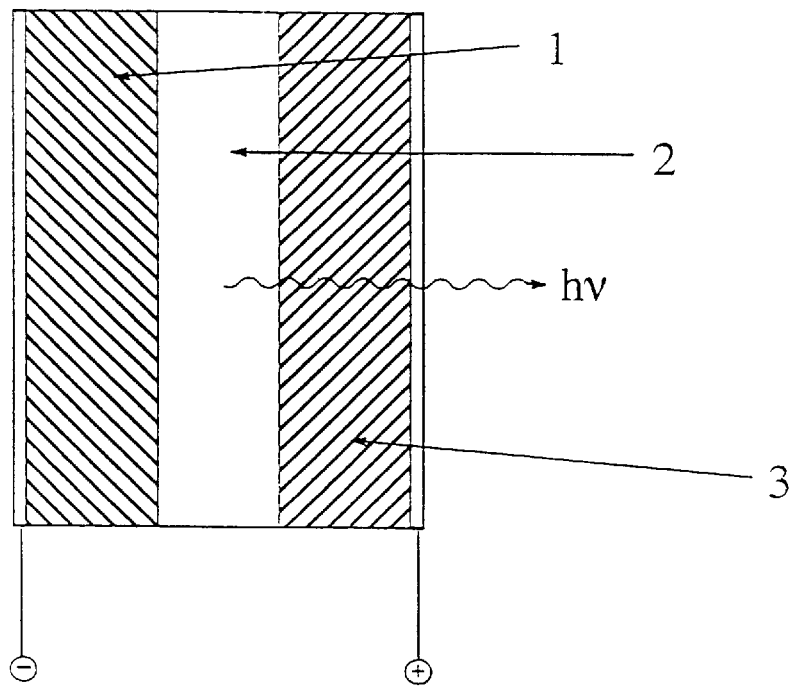
FIG. 1 shows the construction principle of an organic electroluminescent component according to the invention in a three-layer arrangement.
Figure 2:
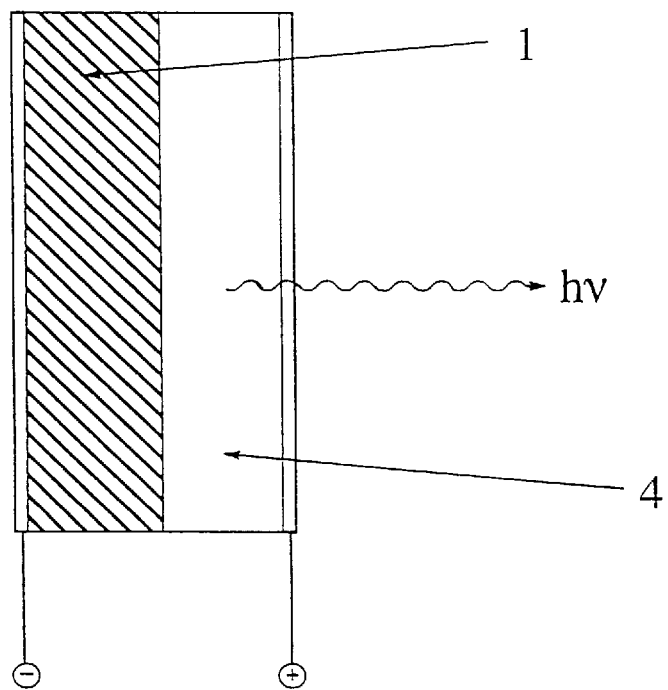
FIG. 2 shows an alternative embodiment of the invention with a two-layer arrangement.

This two-layer arrangement is shown in FIG. 2. A three-layer arrangement according to FIG. 1 is also possible, however, where the layer arrangement comprises a further charge transport layer 3 which conducts holes between the optoelectronically active layers 2 and the anode.

The cathode is usually made from a metal or an alloy with a low work function, for example Mg, MgAg, Li, Al, Na, K, Ca, Rb, Sr, Ce, rare earth metals, as well as alloys thereof comprising antimony or indium.

The inorganic layer which conducts electrons comprises an oxide of a transition metal chosen from the group comprising zirconium oxide $ZrO_2$, hafnium oxide $HfO_2$, vanadium oxide $V_2O_5$, barium titanate $BaTiO_3$, barium-strontium titanate $(Ba, Sr)TiO_3$, strontium titanate $SrTiO_3$, calcium titanate $CaTiO_3$, calcium zirconate $CaZrO_3$, potassium tantalate $KTaO_3$, and potassium niobate $KNbO_3$.

The generation of the N-type conductivity in the oxides may be achieved, for example, by means of a suitable dopant, by a thermal aftertreatment in an inert or reducing atmosphere, or by a combination of these measures.

The inorganic layer which conducts electrons may be a layer of the ceramic type, i.e. a layer made from powder particles, which is subsequently sintered. It may also be a layer of the nanocrystalline type made from very small powder particles which have a particle size between 1 and 100 nm and which form a porous network. Nanocrystalline layers may be manufactured, for example, in a sol-gel process. The layer may alternatively be amorphous, colloidal, or microcrystalline and be manufactured by a vacuum deposition technique such as vaporizing, PCVD, MOCVD, etc. Layer thicknesses of less than 100 nm up to an upper limit of approximately 5 mm are possible, depending on the manufacturing technique and conductivity of the oxide material.

Various arrangements are possible for the sequence of the optoelectronically active layers. For example, it may comprise only a single organic layer. This may be formed by a conductive organic polymer which itself is capable of light emission. It may alternatively comprise one or several conductive organic polymers and one or several organic pigment compounds, while the polymers and the pigment compounds in the layer may either be physically mixed or chemically bound.

The optoelectronically active layers may comprise one or several organometallic complexes of rare earth metals with organic oxygen, sulphur, or nitrogen ligands as the organic emitter. Organometallic complexes are understood to be complexes with said organic ligands in which the bonds are achieved by means of the hetero atoms within the scope of the present invention. Depending on the desired color of the emitted light, several rare earth metal complexes may also be used. Rare earth metal complexes may also be used which are not capable of sublimation or which are not electrically conductive.

The rare earth metal ion may be, for example, $Eu^{2+}$, $Eu^{3+}$, $Tb^{3+}$, $Tm^{3+}$, $Dy^{3+}$, $Sm^{3+}$ or $Pr^{3+}$.

Red fluorescence can be generated with europium and samarium complexes, green fluorescence with the terbium complexes, and blue fluorescence with the thulium and dysprosium complexes.

Particularly suitable rare earth metal complexes having the general composition $SE[L_1]_3[L_2]_n$. SE here is a trivalent rare earth metal cation, $L_1$ is an anionic ligand which may be monodentate or bidentate, and $L_2$ is a neutral ligand which may be monodentate or bidentate. n is chosen such that all coordination locations of the rare earth ion are saturated, so that n may assume the values 0, 1, 2, 3, and 4. $L_1$ and $L_2$ are always two different ligands. The corresponding formula for $Eu^{2+}$ is $Eu[L_1]_2[L_2]_n$.

Particularly suitable for the ligand $L_1$ are the beta-diketonates $R_1C(OH)CHCOR_2$. The rests $R_1$ and $R_2$ may be $F_3C$—, thenoyl $C_4H_3S$—, furanoyl $C_4H_3O$—, t-butyl, and perfluororo-n-propyl $C_3F_7$—. If $R_1$ and $R_2$ are $CF_3$— rests, the beta-diketonate hexafluoroacetylacetonate (hfa) is obtained. If $R_1$ and $R_2$ are a t-butyl rest, the beta-diketonate 2,2,6,6-tetramethyl-3,5-heptandione (thd) is obtained. If $R_1$ is a thenoyl rest and $R_2$ a $CF_3$-rest, the beta-diketone thenoyltrifluoroacetylacetonate (ttfa) is obtained. If $R_1$ is a furanoyl rest and $R_2$ a $Cf_3$-rest, the beta-diketone furanolyl-trifluoroacetylacetonate (ftfa) is obtained. If $R_1$ is a t-butyl rest and $R_2$ is a perfluoro-n-propyl rest, the beta-diketone 7,7-dimethyl-1,1,1,2,2,3,3-heptafluoro-4,6-octandione (FOD) is obtained. A further beta-diketone which is suitable as a ligand is 3-(trifluoromethylhydroxymethylene)-1-camphor.

Particularly efficient are the rare earth chelate complexes with ligands $L_1$, the anions of aromatic carbonic acids such as benzoic acid, dimethylpyridine acid, and methylpyridine acid.

The ligands $L_2$ are neutral ligands which may be monodentate or multidentate. The monodentate ligands may be pyridine and its derivatives, trialkylphosphinoxide, alkylphenylphosphinoxide, and triphenylphosphinoxide, dialkylsulphoxide, alkylphenylsulphoxide and diphenylsulphoxide, alkylamine, alkylphenylamine, and phenylamine, as well as alkylphosphate, alkylphenylphosphate, and phenylphosphate.

Pluridentate ligands are 2,2'bipyridine, 2,2',6, 2"terpyridine, 1,10-phenanthroline, and N,N,N',N'-tetramethylethylenediamine and its derivatives.

Particularly suitable ligands $L_2$ are those with a phosphonate or caboxylate group, for example phosphonated or carboxylated polypyridyl ligands such as 2,2':6',2"-terpyridine-4'-phosphonate (4'-$PO_3H_2$-terpy) or 2,2'-bipyridyl-4,4'-dicarboxylate. These ligands at the same time form a light-emitting chelate complex with the rare earth metal ions while they are adsorbed to the oxide of the layer which conducts electrons via the phosphonate or caboxylate group. The rare earth metal complexes are bonded to the surface of the layer which conducts electrons in this manner. The adsorbed complex acts as a charge transfer sensitizer, and the electron transition from the conduction band of the oxide into the excited state of the organic emitter takes place ultra fast and with a high quantum efficiency.

Suitable materials for the anode from which holes are injected into the optoelectronically active layers are metals, metal oxides, and electrically conductive organic polymers with a high work function for electrons. Examples are thin, transparent layers of indium-doped tin oxide (ITO), gold, and polyaniline.

At least one of the electrodes, usually the anode, is transparent to visible light so that the emitted light can emerge to the exterior. The entire layer structure is provided on a substrate which should also be transparent to visible light if the emitted light is to issue from the side which faces the substrate.

Given such a construction of the electroluminescent organic component, with a layer of material which conducts electrons but which does not or substantially not conduct holes arranged between the cathode and the optoelectronically active layers, the electrons coming from the cathode can only reach the optoelectronically active layer but not the anode. Inversely, holes from the anode can only reach the optoelectronically active layer but not the cathode. This charge carrier confinement achieves that the leakage currents through the component are small and the optoelectronic efficiency of the component is increased, because many charge carriers are forced to remain in the vicinity of the optoelectronically active layer and accordingly transmit their energy to the emitter.

The component according to the invention in addition has a very good charge carrier balance. Since the injection of electrons from the cathode and holes from the anode may have strongly different efficiencies, the ratio of electrons to holes in the optoelectronically active layer may differ considerably from the ideal value 1 in components without one-way impervious transport layers. Since the energy transfer to the luminous centers in the optoelectronically active layer is based on the recombination of pairs of electrons and holes, this reduces the efficiency of the component. In the component according to the invention, the excess charge carriers remain confined in the corresponding boundary layers of the optofunctional layer and generate space charge zones depending on their charge which reinforce the injection of the minority charge carriers of opposite charge. The ratio of the charge carriers in the component according to the invention is thus better balanced and the efficiency of the component is enhanced.

Embodiment 1:

200 g $SrCO_3$, 110 g $TiO_2$, and 540.2 mg $Nb_2O_5$ are mixed with distilled water and milled in the wet state for 24 hours. The suspension thus obtained is dried and the resulting powder is calcinated at 1100° C. for 4 hours. Then the calcinated powder is pressed into 2–3 mm thick slices of 10 mm diameter under a pressure of 5 tons. The slices are subsequently sintered in the air at 1200° C. for 2 hours and then at 1350° C. for 4 hours. Nitrogen/hydrogen in a ratio of 3:1 is passed over the slices during the cooling-down phase after the last heating step. The cooling rate is kept constant at 7° C. $\text{min}^{-1}$ during this. Finally, one side of each slice is coated with indium metal vapour in vacuo (contact layer) (Sundaram, S. K.; J. Mater. Sci. Mater. Electron. 5 (1994) 344–346). A solution of 2.5% by weight of poly (vinylcarbazol) and 0.1% by weight of $Eu(Ttfa)_3phen$ (Eu=europium; Ttfa=1-(2-thienyl)-4,4,4-trifluoro-1,3-butandione, phen=1,10-phenanthroline) in THF is provided on the non-contacted slice side from the solution by means of a spinning process. A thin, transparent gold film is vapor-deposited as the anode. The luminescent diode shows a red fluorescence.

Embodiment 2:

A solution of 2.5% by weight of polyvinylcarbazol and 0.01% by weight of Coumarin-6 (laser pigment, Lambada Physics) in a 1:1 mixture of THF and 1,1,1-trichloroethane is provided in a spinning process on an uncovered, contacted n-strontium titanate substrate in accordance with embodiment 1. A thin, transparent gold film is vapor-deposited as the anode. The luminous diode shows a green fluorescence.

We claim:

1. An organic electroluminescent component having a layer arrangement comprising:

a) a first electrode layer, b) a second electrode layer, c) an inorganic, electron conducting layer that conducts electrons and, d) at least one optoelectronically active layer with at least one light-emitting layer which comprises an organic emitter, said inorganic, electron conducting layer and said at least one optoelectronically active layer positioned between said first and said second electrode layers, said inorganic, electron conducting layer being an N-type conducting oxide of a transition metal selected from the group consisting of zirconium oxide, hafnium oxide, vanadium oxide, barium titanate, barium-strontium titanate, strontium titanate, calcium titanate, calcium zirconate and, potassium niobate and said organic emitter comprising at least one organometallic complex of a rare earth metals with organic oxygen, sulfur, or nitrogen ligands.

2. An organic electroluminescent component as claimed in claim 1, characterized in that the N-type conducting oxide chosen from the group consisting of zirconium oxide, hafnium oxide, vanadium oxide, barium titanate, barium-strontium titanate, strontium titanate, calcium titanate, calcium zirconate, potassium tantalate and potassium niobate is a doped oxide.

3. An organic electroluminescent component as claimed in claim 1, characterized in that the oxide of the transition metal is niobium-doped strontium titanate $SrTiO_3$.

4. An organic electroluminescent component as claimed in claim 1, characterized in that the organic emitter comprises a rare earth metal complex with a ligand comprising a carboxylate or a phosphonate group.

* * * * *